(12) United States Patent
Han et al.

(10) Patent No.: US 12,089,477 B2
(45) Date of Patent: Sep. 10, 2024

(54) DISPLAY DEVICE INCLUDING CURVED SIGNAL LINES

(71) Applicant: LG Display Co., Ltd., Seoul (KR)

(72) Inventors: Jonghyun Han, Seoul (KR); SungWook Yoon, Goyang-si (KR); MinSeob Song, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/155,513

(22) Filed: Jan. 17, 2023

(65) Prior Publication Data

US 2023/0157130 A1 May 18, 2023

Related U.S. Application Data

(63) Continuation of application No. 17/112,832, filed on Dec. 4, 2020, now Pat. No. 11,587,991.

(30) Foreign Application Priority Data

Dec. 20, 2019 (KR) .................. 10-2019-0171978

(51) Int. Cl.
*H10K 59/65* (2023.01)
*G06F 3/041* (2006.01)
(Continued)

(52) U.S. Cl.
CPC ........... *H10K 59/65* (2023.02); *G06F 3/0412* (2013.01); *H10K 50/844* (2023.02);
(Continued)

(58) Field of Classification Search
CPC .. H10K 50/844; H10K 50/816; H10K 50/828; H10K 50/80; H10K 59/65; H10K 59/122; H10K 59/131; H10K 59/40; H10K 59/1213; H10K 59/1216; H10K 59/123; H10K 59/35; H10K 59/353; H10K 59/00; H10K 77/111; H10K 2102/00; H10K 2102/311; H04N 23/57; H01L 27/14678; H01L 33/12; G02F 1/133305;
(Continued)

(56) References Cited

U.S. PATENT DOCUMENTS 10,541,380 B1 * 1/2020 Sung .................. H10K 59/124
10,818,874 B2 10/2020 Park
(Continued)

FOREIGN PATENT DOCUMENTS

CN 109871157 A 6/2019
CN 110007804 A 7/2019
(Continued)

*Primary Examiner* — Ida M Soward
(74) *Attorney, Agent, or Firm* — Seed IP Law Group LLP

(57) ABSTRACT

A display device according to an embodiment of the present disclosure is described. The display device includes a see-through area for camera and a routing area disposed around the see-through area for camera. A camera module is disposed in the see-through area for camera. The routing area is overlapped by at least one data line and scan line. The display device includes a pixel area which includes the see-through area for camera and the routing area. The pixel area includes a plurality of sub-pixels including an organic light emitting element and a cathode.

21 Claims, 10 Drawing Sheets

(51) Int. Cl.

| | | |
|---|---|---|
| *H10K 50/84* | (2023.01) | |
| *H10K 50/844* | (2023.01) | |
| *H10K 59/12* | (2023.01) | |
| *H10K 59/122* | (2023.01) | |
| *H10K 59/13* | (2023.01) | |
| *H10K 59/131* | (2023.01) | |
| *H10K 59/40* | (2023.01) | |
| *G02F 1/1333* | (2006.01) | |
| *G06F 1/16* | (2006.01) | |
| *G09F 9/30* | (2006.01) | |
| *H01L 27/146* | (2006.01) | |
| *H01L 33/12* | (2010.01) | |
| *H10K 50/816* | (2023.01) | |
| *H10K 50/828* | (2023.01) | |
| *H10K 59/121* | (2023.01) | |
| *H10K 59/123* | (2023.01) | |
| *H10K 59/35* | (2023.01) | |
| *H10K 77/10* | (2023.01) | |
| *H10K 102/00* | (2023.01) | |

(52) U.S. Cl.
CPC ......... *H10K 59/122* (2023.02); *H10K 59/131* (2023.02); *H10K 59/40* (2023.02); *G02F 1/133305* (2013.01); *G06F 1/1652* (2013.01); *G09F 9/301* (2013.01); *G09G 2300/0408* (2013.01); *G09G 2300/0804* (2013.01); *G09G 2380/02* (2013.01); *H01L 27/14678* (2013.01); *H01L 33/12* (2013.01); *H10K 50/816* (2023.02); *H10K 50/828* (2023.02); *H10K 59/1213* (2023.02); *H10K 59/1216* (2023.02); *H10K 59/123* (2023.02); *H10K 59/35* (2023.02); *H10K 59/353* (2023.02); *H10K 77/111* (2023.02); *H10K 2102/00* (2023.02); *H10K 2102/311* (2023.02)

(58) Field of Classification Search
CPC .... G06F 1/1652; G06F 3/0412; G06F 3/0446; G06F 3/0445; G06F 3/041; G06F 2203/04111; G06F 2203/04112; G09F 9/301; G09G 2300/0408; G09G 2300/0804; G09G 2380/02
See application file for complete search history.

(56) References Cited

U.S. PATENT DOCUMENTS

| | | | |
|---|---|---|---|
| 10,879,330 | B1 | 12/2020 | Cui et al. |
| 10,978,666 | B2 | 4/2021 | Park |
| 2017/0288003 | A1* | 10/2017 | Kim ..................... H10K 59/131 |
| 2019/0018540 | A1 | 1/2019 | Ko et al. |
| 2019/0051708 | A1 | 2/2019 | Jeong et al. |
| 2019/0081118 | A1* | 3/2019 | Oh ........................ H10K 59/124 |
| 2019/0081389 | A1 | 3/2019 | Tsai et al. |
| 2019/0214596 | A1 | 7/2019 | Park |
| 2019/0288047 | A1* | 9/2019 | Jeong ..................... H10K 50/11 |
| 2020/0044006 | A1* | 2/2020 | Lee ....................... H10K 50/841 |
| 2020/0064968 | A1* | 2/2020 | Kim ........................ G06F 3/0443 |
| 2020/0098843 | A1 | 3/2020 | Jeon et al. |
| 2020/0127231 | A1* | 4/2020 | Yun ........................ H10K 59/124 |
| 2020/0133415 | A1 | 4/2020 | Choi et al. |
| 2020/0168671 | A1* | 5/2020 | Jang ....................... G06F 3/0412 |
| 2020/0175900 | A1 | 6/2020 | Han et al. |
| 2020/0176542 | A1* | 6/2020 | Park ........................ H10K 77/10 |
| 2020/0176657 | A1 | 6/2020 | Jang et al. |
| 2020/0227505 | A1 | 7/2020 | Kim et al. |
| 2020/0235194 | A1 | 7/2020 | Ito et al. |
| 2020/0236259 | A1 | 7/2020 | Nakamura et al. |
| 2020/0278312 | A1* | 9/2020 | Jeong ................. G01R 31/2837 |
| 2020/0373362 | A1 | 11/2020 | Won et al. |
| 2020/0388230 | A1 | 12/2020 | Lee |
| 2021/0225981 | A1 | 7/2021 | Yi |
| 2022/0029132 | A1* | 1/2022 | Lee ....................... H10K 50/865 |

FOREIGN PATENT DOCUMENTS

| | | | |
|---|---|---|---|
| CN | 110021625 A | 7/2019 | |
| CN | 110021640 A | 7/2019 | |
| CN | 209356818 U | 9/2019 | |
| EP | 3176771 A2 * | 6/2017 | ............... G09G 3/20 |

* cited by examiner

DISPLAY DEVICE INCLUDING CURVED SIGNAL LINES

CROSS-REFERENCE TO RELATED APPLICATIONS

This application is a continuation of U.S. application Ser. No. 17/112,832 filed Dec. 4, 2020, which claims the priority of Korean Patent Application No. 10-2019-0171978 filed on Dec. 20, 2019, in the Korean Intellectual Property Office, the disclosure of which is incorporated herein by reference.

BACKGROUND

Technical Field

The present disclosure relates to a display device, and more particularly, to a display device including a see-through area for camera within a pixel area.

Description of the Related Art

Image display devices, which display a variety of information on a screen, are a core technology of information and communication era and are becoming increasingly thinner, lighter, more portable, and higher in performance. Thus, display devices capable of eliminating disadvantages of heavy and bulky structures of cathode ray tubes (CRTs) have received attention.

Examples of the display devices may include a liquid crystal display (LCD) device, a plasma display panel (PDP), an electroluminescence display (ELD) device and a micro-LED display (µLED) device.

Such a display device is employed in various types of appliances such as a television (TV), a monitor and a portable phone, and is being further advanced through the addition of a camera, a speaker and a sensor thereto.

BRIEF SUMMARY

The inventors of the present disclosure realized that conventional display devices have a problem in that a non-pixel area is increased and a pixel area is decreased due to the camera, the speaker, the sensor and the like being disposed in the non-pixel area outside the pixel area of the display device. Therefore, to reduce the non-pixel area of a display device, the inventors of the present disclosure have attempted to provide a see-through area for camera to take images within a pixel area. However, the inventors of the present disclosure have recognized that if a through-hole is formed in the display device to improve the transmittance of the see-through area for camera, moisture may permeate into pixels around the see-through area for camera, which may cause defects.

Also, the inventors of the present disclosure have recognized that if the see-through area for camera overlaps pixels of the display device, the imaging quality of the camera may be degraded. Thus, the inventors of the present disclosure have studied the structure of a display device capable of suppressing the permeation of moisture while increasing or maximizing the transmittance of a see-through area for camera.

In addition, if a touch panel having a metal mesh structure is provided on the see-through area for camera, the aperture ratio, e.g., transmittance, of the see-through area for camera may be degraded. Also, if a touch electrode is eliminated, the see-through area for camera cannot sense a touch.

Therefore, the inventors of the present disclosure have attempted to solve various shortcomings of the related art as well as the technical problems identified and set forth above. One or more embodiments of the present disclosure provides a display device including an optimized see-through area for camera.

According to an aspect of the present disclosure, a display device is provided. The display device includes a see-through area for camera in which a camera module is configured to be disposed and a routing area disposed adjacent to the see-through area for camera and overlapped by at least one data line and scan line. The display device also includes a pixel area which includes the see-through area for camera and the routing area and includes a plurality of sub-pixels including an organic light emitting element and a cathode is disposed therein. The display device further includes a touch panel having a metal mesh structure on the pixel area, the see-through area for camera and the routing area. A touch electrode of the touch panel may have a lower pitch in the see-through area for camera than in the pixel area.

The plurality of sub-pixels may be not disposed in the see-through area for camera.

The plurality of sub-pixels may be not disposed in the routing area.

The display device may further include a first inorganic encapsulation layer covering the pixel area, a foreign material cover layer on the first inorganic encapsulation layer and a second inorganic encapsulation layer on the foreign material cover layer.

The second inorganic encapsulation layer may be flat or substantially flat in the see-through area for camera and the routing area.

The pixel area may include an overcoating layer and a bank-spacer layer, and the see-through area for camera may not include the overcoating layer and the bank-spacer layer.

The see-through area for camera may not include at least the organic light emitting element.

The see-through area for camera may not include at least the cathode.

The cathode includes a translucent electrode.

The pixel area may include an overcoating layer and a bank-spacer layer, and the overcoating layer and the bank-spacer layer may be extended to the see-through area for camera a second inorganic encapsulation layer on the foreign material cover layer.

The touch panel may be disposed on the second inorganic encapsulation layer.

The touch electrode may have a lower pitch in the see-through area for camera and the routing area adjacent to the see-through area for camera than in the pixel area.

The touch electrode may have a lower pitch in the see-through area for camera than in the pixel area, and the touch electrode may have a smaller line width in at least the see-through area for camera than in the pixel area.

According to the present disclosure, it is possible to reduce the size of a non-pixel area by placing a see-through area for camera, where a camera module is disposed, within a pixel area.

Also, according to the present disclosure, the see-through area for camera of a display device is sealed, and, thus, it is possible to improve transmittance and also possible to suppress the permeation of moisture into organic light emitting elements. Therefore, it is possible to suppress or delay the permeation of moisture or oxygen into the organic light emitting elements. Further, it is possible to reduce or minimize the size of the see-through area for camera within the pixel area.

Furthermore, according to the present disclosure, the see-through area for camera may have a touch function and the transmittance of the see-through area for camera may be improved.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
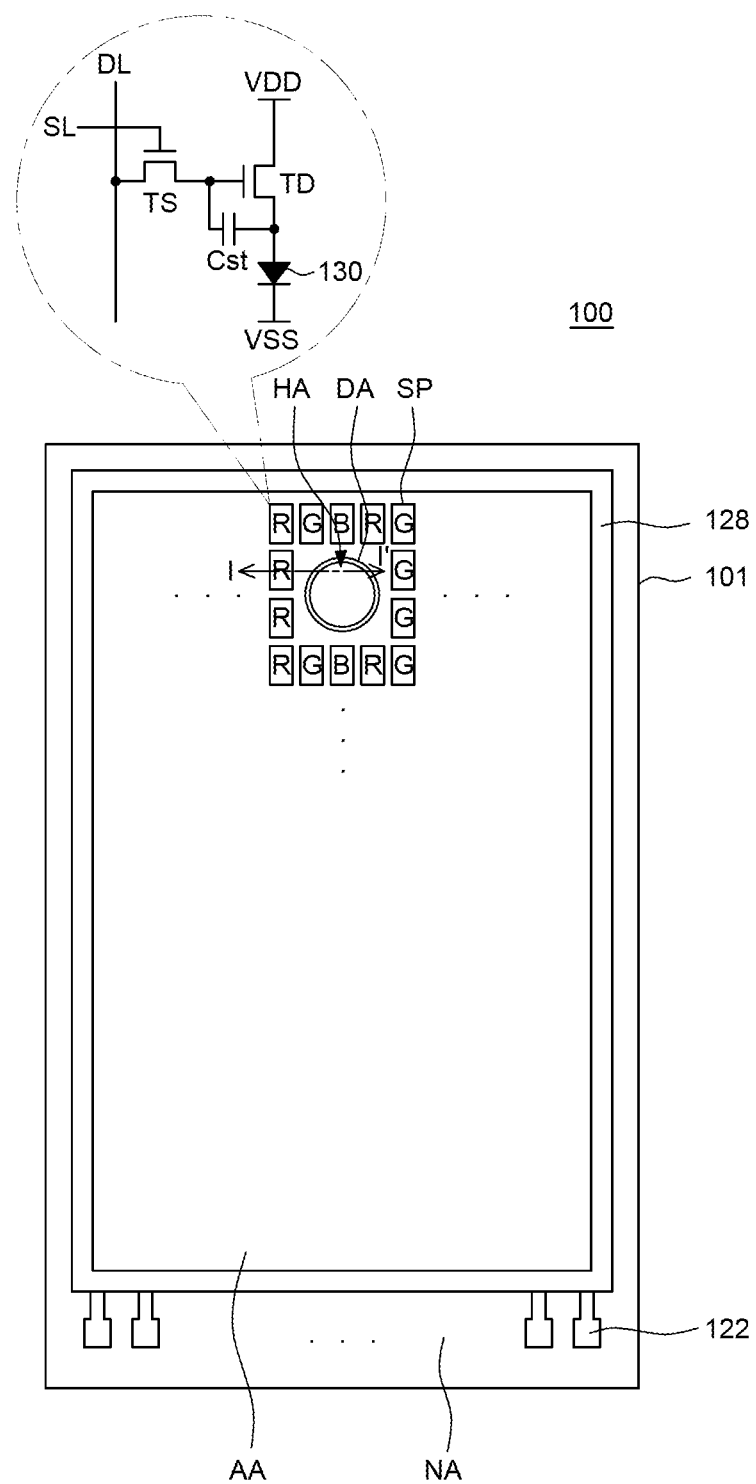
FIG. 1 is a view illustrating a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to embodiments of the present disclosure will be described in detail with reference to accompanying drawings.

A display device 100 according to an embodiment of the present disclosure will be described with reference to FIG. 1 through FIG. 3.

Figure 2:
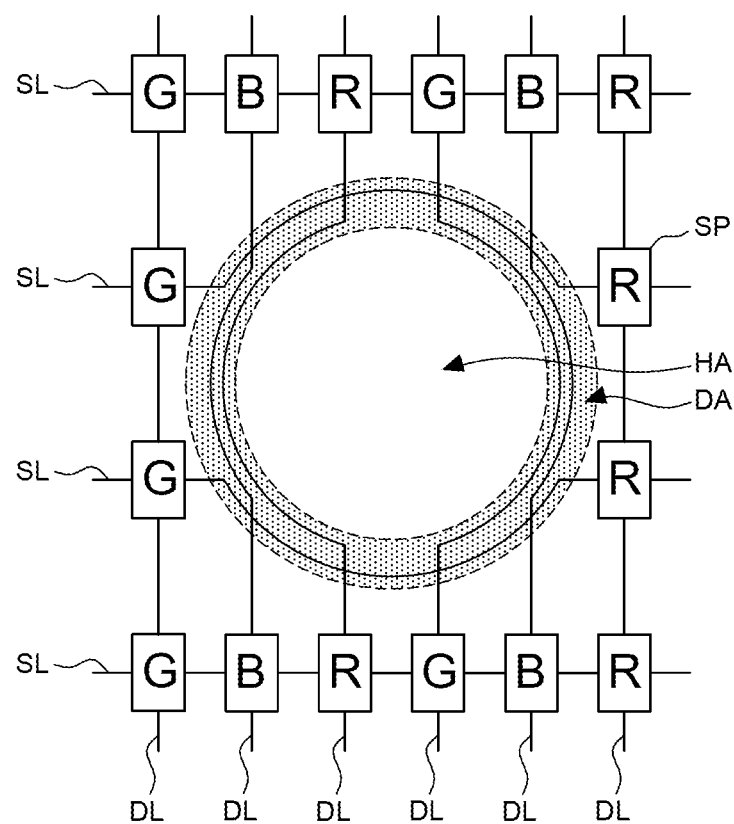
FIG. 2 is a cross-sectional view of the display device as taken along a line I-I' of FIG. 1.
Figure 3:
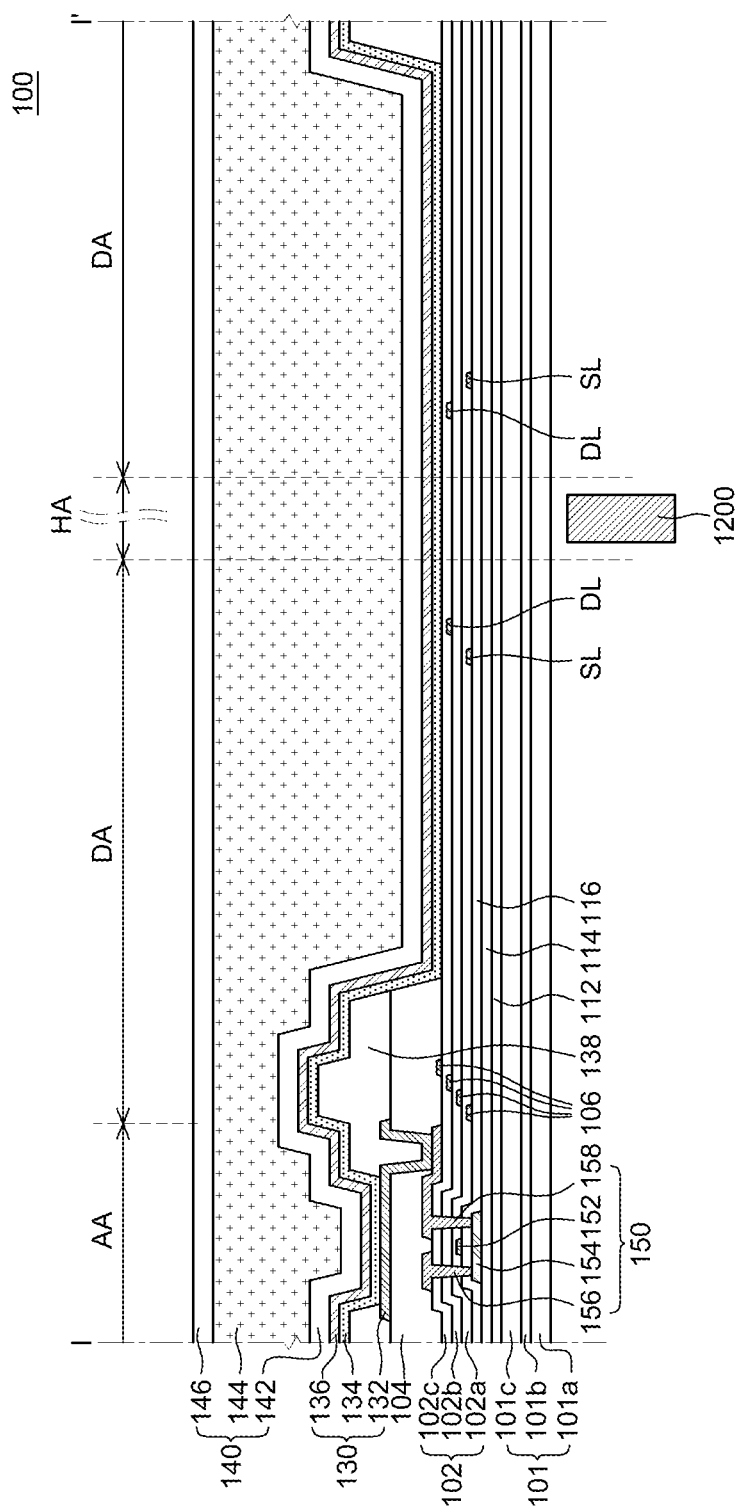
FIG. 3 is a cross-sectional view of the display device according to an embodiment of the present disclosure.

The display device 100 illustrated in FIG. 1 through FIG. 3 may include a pixel area AA and a non-pixel area NA. In the pixel area AA, a see-through area for camera HA (hereinafter, simply referred to as "camera see-through area" or "see-through area") and a routing area DA between the camera see-through area HA and the pixel area AA are disposed.

In the non-pixel area NA, a plurality of pads 122 for supplying driving signals to a plurality of signal lines 106, respectively, disposed in the pixel area AA is formed. Herein, the signal lines 106 may include at least one of a scan line SL, a data line DL, a high-potential voltage (VDD) supply line and a low-potential voltage (VSS) supply line.

The camera see-through area HA is disposed within the pixel area AA and thus may be surrounded by a plurality of sub-pixels SP disposed in the pixel area AA. The camera see-through area HA is illustrated as having a circular shape, but is not limited thereto and may have a polygonal shape or an oval shape. That is, the shape of the camera see-through area HA may be determined depending on the shape of a sensor module corresponding thereto. For example, a general camera and a wide-angle camera may be disposed together within the camera see-through area HA. In this case, the camera see-through area HA may have an oval shape.

Referring to FIG. 2, the routing area DA is disposed along an outer periphery of the camera see-through area HA within the pixel area AA. In the routing area DA, at least scan lines SL and data lines DL may be disposed. The scan lines SL and the data lines DL in the routing area DA may be disposed out of a viewing angle (or a field of view) of a camera module 1200. In this case, it is possible to suppress the degradation in imaging quality of the camera module 1200.

In some embodiments, the scan lines SL and the data lines DL are arranged in the routing area DA. The scan lines SL and the data lines DL are arranged such that it does not overlap the camera see-through area HA. For example, the scan lines SL and the data lines DL are arranged to bypass the camera see-through area HA in order to improve the aperture ratio of the camera see-through area HA. That is, the sub-pixels SP and the signal lines 106 may not be formed in the camera see-through area HA. Therefore, the transmittance of the camera see-through area HA may be improved.

Each of the sub-pixels SP is configured to include a light emitting diode 130. The sub-pixel SP may include the light emitting diode 130 and a pixel driving circuit configured to independently drive the light emitting diode 130. Hereinafter, an organic light emitting diode will be described as an example of the light emitting diode 130.

The pixel driving circuit may include a switching transistor TS, a driving transistor TD and a storage capacitor Cst.

When a scan pulse is supplied to a scan line SL, the switching transistor TS is turned on and supplies a data signal supplied to a data line DL to the storage capacitor Cst and a gate electrode of the driving transistor TD.

The driving transistor TD controls a current supplied from the VDD supply line to the light emitting diode 130 in response to the data signal supplied to the gate electrode of the driving transistor TD. Thus, it is possible to control the luminance of the light emitting diode 130. Further, even when the switching transistor TS is turned off, the driving transistor TD may supply a current due to a voltage charged in the storage capacitor Cst, which enables the light emitting diode 130 to keep emitting light.

A transistor 150 includes an active layer 154 disposed on an active buffer layer 114 and a gate electrode 152 overlapping the active layer 154 with a gate insulating layer 116 interposed therebetween as illustrated in FIG. 3. The transistor 150 also includes a source electrode 156 and a drain electrode 158 which are in contact with the active layer 154 and formed on a multilayered interlayer insulating layer 102 as illustrated in FIG. 3. However, the transistor 150 is not limited thereto, and the active buffer layer 114 may be omitted as needed.

The active layer 154 is formed of at least any one of an amorphous semiconductor material, a polycrystalline semiconductor material and an oxide semiconductor material. The active layer 154 may include a channel region, a source region and a drain region. The channel region overlaps the gate electrode 152 with the gate insulating layer 116 interposed therebetween and is located between the source electrode 156 and the drain electrode 158. The source region of the active layer 154 is electrically connected to the source electrode 156 through a contact hole penetrating the gate insulating layer 116 and the multilayered interlayer insulating layer 102. The drain region of the active layer 154 is electrically connected to the drain electrode 158 through a contact hole penetrating the gate insulating layer 116 and the multilayered interlayer insulating layer 102.

A multi-buffer layer 112 is interposed between the active layer 154 and a substrate 101. The multi-buffer layer 112 delays the diffusion of moisture and/or oxygen permeating into the substrate 101. The active buffer layer 114 which may be disposed on the multi-buffer layer 112 protects the active layer 154 and suppresses various kinds of defects inflowed from the substrate 101.

The substrate 101 may be composed of a first polyimide substrate 101a, a substrate insulating layer 101b and a second polyimide substrate 101c, but is not limited thereto. The active buffer layer 114 and the gate insulating layer 116 may be formed of SiOx to suppress the diffusion of hydrogen into the active layer but is not limited thereto.

At least any one of the multi-buffer layer 112, the active buffer layer 114 and the substrate 101 may have a multilayered structure. The active buffer layer 114, the multi-buffer layer 112, the gate insulating layer 116 and the multilayered interlayer insulating layer 102 may be formed as inorganic insulating layers having excellent water barrier properties. For example, the gate insulating layer 116, the active buffer layer 114, the multi-buffer layer 112 and the multilayered interlayer insulating layer 102 may be formed of any one of SiNx and SiOx.

The plurality of signal lines 106 may be formed of the same metal layer as the transistor 150 and the storage capacitor Cst. The plurality of signal lines 106 is provided on the gate insulating layer 116 and the multilayered interlayer insulating layer 102, and, thus, it is possible to design a high-resolution panel. It is also possible to form the storage capacitor Cst by patterning the plurality of signal lines 106.

The multilayered interlayer insulating layer 102 may include a first interlayer insulating layer 102a, a second interlayer insulating layer 102b and a third interlayer insulating layer 102c, but is not limited thereto. The number of interlayer insulating layers 102 may vary, such as two or four or more, depending on the design of the panel.

Particularly, the multi-buffer layer 112 is extended to the routing area DA and the camera see-through area HA. Thus, it is possible to suppress the permeation of oxygen and moisture through the camera see-through area HA and the routing area DA. Further, the visible light transmittance of the multi-buffer layer 112 may be at least 80%. Therefore, even if the camera module 1200 is disposed in the camera see-through area HA, the multi-buffer layer 112 may suppress substantial degradation in quality of taken images.

Also, if the multi-buffer layer 112 and the multilayered interlayer insulating layer 102 are formed flat or substantially flat in the camera see-through area HA, it is possible to eliminate unnecessary image distortion. Therefore, it is possible to suppress the degradation in imaging quality of the camera module 1200. That is, it is possible to reduce or minimize unnecessary distortion.

The plurality of signal lines 106 may be formed of a single layer or a multilayer including Al, Ag, Cu, Pb, Mo, Ti or an alloy thereof. The scan lines SL and the data lines DL may be part of the plurality of signal lines.

The light emitting diode 130 includes an anode 132 connected to the drain electrode 158 of the transistor 150 and at least one organic light emitting element 134 formed on the anode 132. The light emitting diode 130 also includes a cathode 136 formed on the organic light emitting element 134 so as to be connected to the VSS supply line. Herein, the VSS supply line supplies a low voltage VSS relatively lower than a high voltage VDD. The cathode 136 may be a translucent electrode having a visible light transmittance of from about 30% to 60%.

The anode 132 is electrically connected to the drain electrode 158 of the transistor 150 exposed through a pixel contact hole penetrating an overcoating layer 104 disposed on the transistor 150. Herein, the transistor 150 may be a driving transistor TD. The anode 132 in each sub-pixel SP is disposed on the overcoating layer 104 so as to be exposed by a bank-spacer layer 138. The overcoating layer 104 may also be referred to as a planarization layer. The bank-spacer layer 138 may refer to a layer configured to function as a bank and/or a spacer. The bank-spacer layer 138 may be formed to have a difference in height between the bank and the spacer through a half-tone exposure process but is not limited thereto.

If the anode 132 is applied to a bottom emission type electroluminescence display device, the anode 132 is formed of a transparent conductive layer such as indium-tin-oxide (ITO) or indium-zinc-oxide (IZO). If the anode 132 is applied to a top emission type electroluminescence display device, the anode 132 is formed of a multilayer including a transparent conductive layer and an opaque conductive layer having high reflection efficiency. The transparent conductive layer is formed of a material having a relatively high work function such as ITO or IZO. The opaque conductive layer is formed of a single layer or a multilayer including Al, Ag, Cu, Pb, Mo, Ti or an alloy thereof. For example, the anode 132 may have a structure in which a transparent conductive layer, an opaque conductive layer and a transparent conductive layer are laminated sequentially.

The organic light emitting element 134 may be formed by sequentially or reversely laminating a hole transport layer, an emission layer and an electron transport layer on the anode 132. The organic light emitting element 134 may include a common layer formed on the entire surface of the pixel area AA and an emission layer patterned only on the anode 132 for color expression of a specific sub-pixel SP.

The cathode 136 is formed on upper and side surfaces of the organic light emitting element 134 and the bank-spacer layer 138 so as to face the anode 132 with the organic light emitting element 134 interposed therebetween.

An encapsulation unit 140 suppresses the permeation of external moisture or oxygen into the light emitting diode 130 which is vulnerable to external moisture or oxygen. To this end, the encapsulation unit 140 includes a plurality of inorganic encapsulation layers 142 and 146 and a foreign material cover layer 144 disposed between the plurality of inorganic encapsulation layers 142 and 146. The inorganic encapsulation layer 146 is disposed as the uppermost layer. For example, the encapsulation unit 140 may be configured to include at least one inorganic encapsulation layer and at least one foreign material cover layer. In the present disclosure, the structure of the encapsulation unit 140 in which the foreign material cover layer 144 is disposed between the first and second inorganic encapsulation layers 142 and 146 will be described, but is not limited thereto.

The first inorganic encapsulation layer 142 is formed on the cathode 136. The first inorganic encapsulation layer 142 is formed of an inorganic encapsulating material which can be deposited at a low temperature, such as silicon nitride (SiNx), silicon oxide (SiOx), silicon oxynitride (SiON) or aluminum oxide ($Al_2O_3$). Since the first inorganic encapsulation layer 142 is deposited at a low temperature atmosphere, it is possible to protect the organic light emitting element 134, which is vulnerable to a high-temperature atmosphere, during a deposition process of the first inorganic encapsulation layer 142.

The second inorganic encapsulation layer 146 is formed to cover upper and side surfaces of the foreign material cover layer 144 and an upper surface of the first inorganic encapsulation layer 142 exposed by the foreign material cover layer 144. Thus, the upper, lower and side surfaces of the foreign material cover layer 144 are sealed by the first and second inorganic encapsulation layers 142 and 146. Therefore, the first and second inorganic encapsulation layers 142 and 146 reduce or minimize or block the permeation of external moisture or oxygen into the foreign material cover layer 144 or the permeation of moisture or oxygen inside the foreign material cover layer 144 into the light emitting diode 130. The second inorganic encapsulation layer 146 is formed of an inorganic insulating material, such as silicon nitride (SiNx), silicon oxide (SiOx), silicon oxynitride (SiON) or aluminum oxide ($Al_2O_3$).

The foreign material cover layer 144 has a buffering function to relax stress between layers when the electroluminescence display device is bent, and enhances the planarization properties. Also, the foreign material cover layer 144 is formed to have a greater thickness than the inorganic encapsulation layers 142 and 146 in order to suppress the occurrence of cracks caused by a foreign material. The foreign material cover layer 144 is formed of an organic insulating material such as acryl resin, epoxy resin, polyimide, polyethylene or silicon oxycarbide (SiOC).

When the foreign material cover layer 144 is formed, an external dam 128 may be formed to restrict the flow of the foreign material cover layer 144, but is not limited thereto.

In some embodiments, the external dam 128 may be formed to completely surround the periphery of the pixel area AA, where the sub-pixels SP are disposed, as illustrated in FIG. 1. Otherwise, the external dam 128 may be formed between the pixel area AA and the non-pixel area NA. If the non-pixel area NA, where the plurality of pads 122 is disposed, is placed on one side of the substrate 101, the external dam 128 may be disposed on only one side of the substrate 101. If the non-pixel area NA, where the plurality of pads 122 is disposed, is placed on both sides of the substrate 101, the external dam 128 may be disposed on each of the both sides of the substrate 101. If a plurality of external dams 128 is disposed, the external dams 128 are spaced apart from each other at a predetermined distance. Thus, when the foreign material cover layer 144 flows over one external dam 128, another external dam 128 spaced apart therefrom further may block the overflowed foreign material cover layer 144. With various structures of the external dam 128 as described above, it is possible to suppress the spread of the foreign material cover layer 144 to the non-pixel area NA.

The foreign material cover layer 144 is configured to fully cover the camera see-through area HA and the routing area DA. Therefore, if the upper surface of the foreign material cover layer 144 and the second inorganic encapsulation layer 146 are formed flat or substantially flat in the camera see-through area HA and the routing area DA, it is possible to eliminate unnecessary image distortion. Therefore, it is possible to suppress the degradation in imaging quality of the camera module 1200. That is, it is possible to reduce or minimize unnecessary distortion.

Also, the visible light transmittance of the encapsulation unit 140 may be at least 80%. Therefore, even if the camera module 1200 is disposed in the camera see-through area HA, the encapsulation unit 140 may suppress substantial degradation in quality of taken images. However, the present disclosure is not limited thereto.

An area other than the camera see-through area HA may be configured to include at least part of the overcoating layer 104 and the bank-spacer layer 138. The camera see-through area HA may be configured not to include the overcoating layer 104 and the bank-spacer layer 138. According to the above-described configuration, it is possible to reduce the number of insulating layers disposed in the camera see-through area HA. Particularly, if the respective insulating layers have different refractive indexes, unnecessary refraction may occur. In this case, the imaging quality of the camera module 1200 may be degraded. However, by patterning the overcoating layer 104 and the bank-spacer layer 138 in the camera see-through area HA, it is possible to improve the imaging quality.

Figure 4:
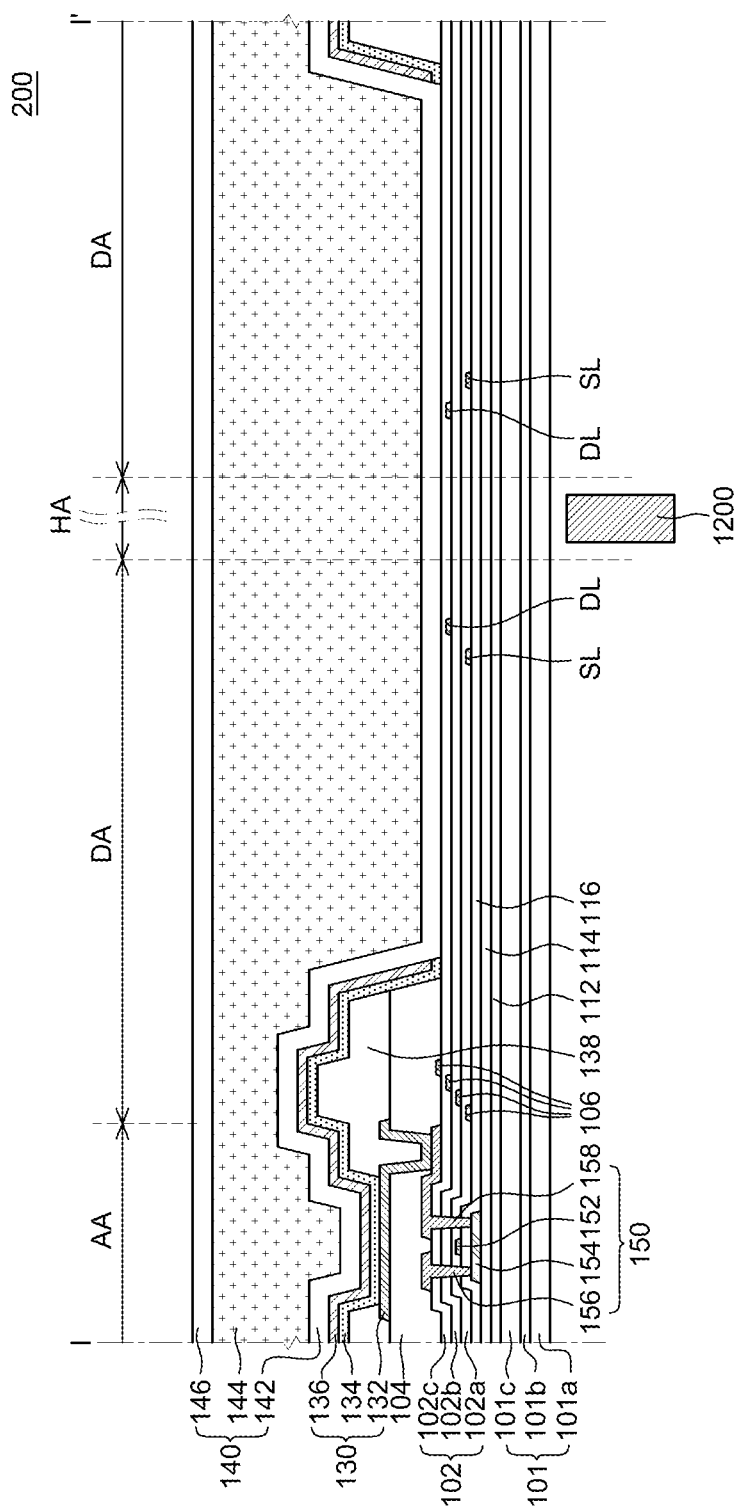
FIG. 4 is a cross-sectional view of a display device according to another embodiment of the present disclosure.

A display device 200 according to another embodiment of the present disclosure will be described with reference to FIG. 4.

The display device 200 according to another embodiment of the present disclosure is substantially the same as the display device 100 according to an embodiment of the present disclosure except that the organic light emitting element 134 and the cathode 136 are patterned in at least the camera see-through area HA. Therefore, hereinafter, a redundant description will be omitted for convenience of explanation.

As for the display device 200 according to another embodiment of the present disclosure, the organic light emitting element 134 and the cathode 136 are not disposed in at least the camera see-through area HA. The organic light emitting element 134 and the cathode 136 may not be disposed in at least part of the routing area DA. The organic light emitting element 134 and the cathode 136 may be patterned according to a mask design.

As described above, the cathode 136 may be a translucent electrode having a visible light transmittance of from about 30% to 60%. Particularly, if the cathode 136 has translucent properties, it may provide a micro-cavity effect by which the luminance of the sub-pixels SP can be improved. However, the cathode 136 disposed in the camera see-through area HA may decrease the transmittance of the camera see-through area HA and degrade the imaging quality of the camera module 1200 due to reflection.

The organic light emitting element 134 is vulnerable to the permeation of moisture and oxygen and may act as a path of moisture permeation. If the organic light emitting element 134 is patterned in the camera see-through area HA and removed, the path of moisture permeation may be removed. Therefore, the reliability of the display device 200 with respect to moisture and oxygen may be improved.

In addition thereto, if neither the organic light emitting element 134 nor the cathode 136 is disposed in the camera see-through area HA, the encapsulation unit 140 and the multilayered interlayer insulating layer 102 may be directly sealed. Therefore, it is possible to further reduce the possibility of permeation of moisture through the camera see-through area HA.

In other words, an area where the organic light emitting element 134 and the cathode 136 are patterned may not overlap the viewing angle of the camera module 1200. The camera module 1200 may vary in viewing angle, and an area to be patterned may be determined depending on the viewing angle.

Figure 5:
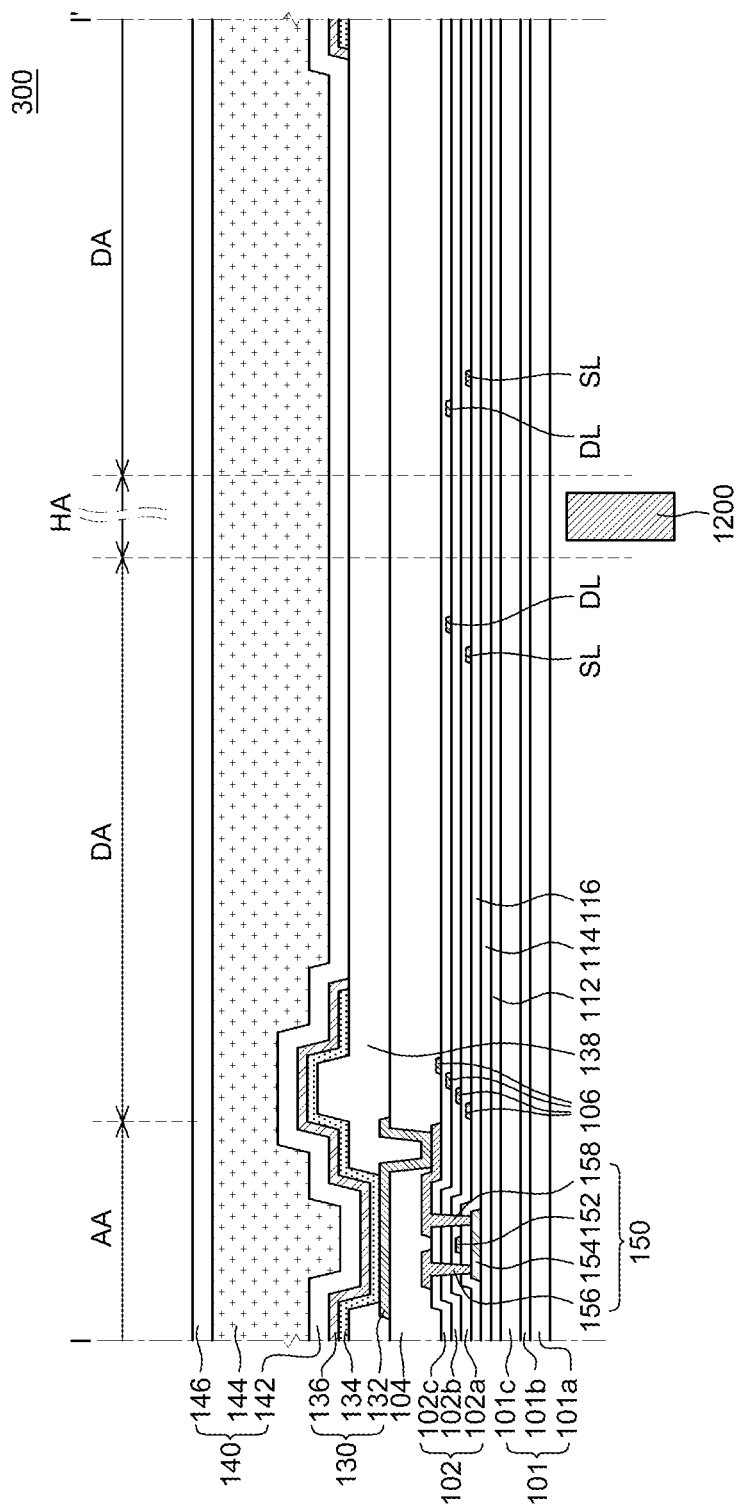
FIG. 5 is a cross-sectional view of a display device according to yet another embodiment of the present disclosure.

A display device 300 according to yet another embodiment of the present disclosure will be described with reference to FIG. 5.

The display device 300 according to yet another embodiment of the present disclosure is substantially the same as the display device 200 according to another embodiment of the present disclosure except that the overcoating layer 104 and the bank-spacer layer 138 are extended to the camera see-through area HA. Therefore, hereinafter, a redundant description will be omitted for convenience of explanation.

As for the display device 300 according to yet another embodiment of the present disclosure, the overcoating layer 104 and the bank-spacer layer 138 are extended to at least the camera see-through area HA.

According to the above-described configuration, it is possible to reduce the thickness of the encapsulation unit 140 in the camera see-through area HA and the routing area DA.

Specifically, as the distance between the first inorganic encapsulation layer 142 and the second inorganic encapsulation layer 146 increases, the thickness of the foreign material cover layer 144 in the camera see-through area HA may increase. Also, the flatness of the upper surface of the foreign material cover layer 144 may decrease. For example, if the foreign material cover layer 144 has a high viscosity, the upper surface of the foreign material cover layer 144 may be concave in the camera see-through area HA.

However, since the overcoating layer 104 and the bank-spacer layer 138 are extended to the routing area DA and the camera see-through area HA, the thickness of the encapsulation unit 140 may be reduced. Thus, the flatness of the upper surface of the encapsulation unit 140 may be improved.

Figure 6:
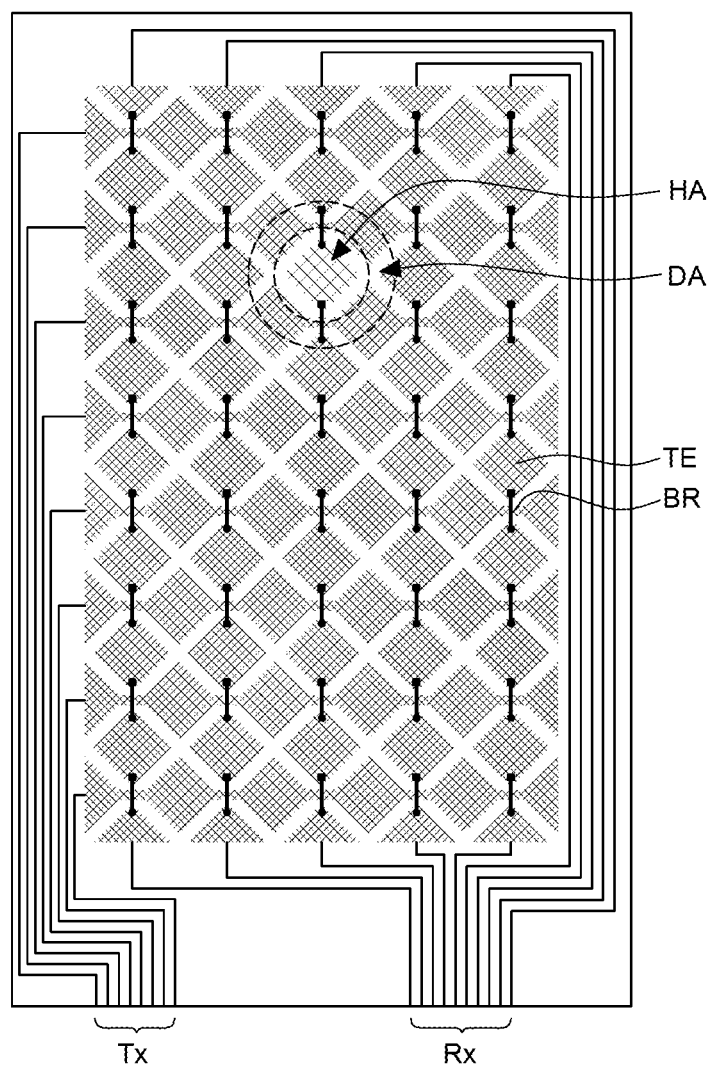
FIG. 6 is a plan view illustrating a touch device of a display device according to still another embodiment of the present disclosure.
Figure 7:
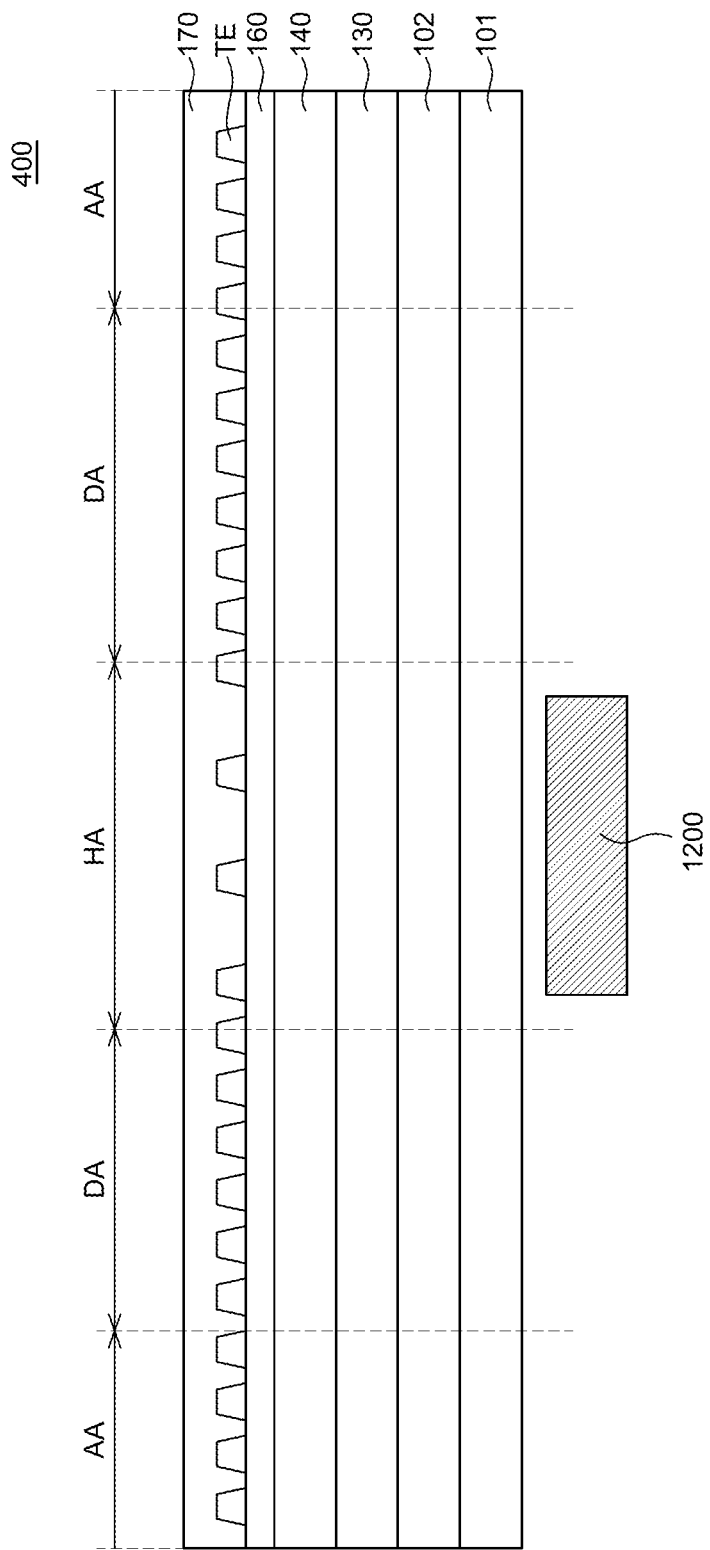
FIG. 7 is a cross-sectional view illustrating the touch device of the display device according to still another embodiment of the present disclosure.

A display device 400 according to still another embodiment of the present disclosure will be described with reference to FIG. 6 and FIG. 7.

The display device 400 according to still another embodiment of the present disclosure may further include a touch panel TP which is designed in consideration of the camera see-through area HA. The display device 400 according to still another embodiment of the present disclosure is substantially the same as the above-described embodiments of the present disclosure except for the touch panel TP. Therefore, hereinafter, a redundant description will be omitted for convenience of explanation.

The touch panel TP is configured to include a touch electrode TE having a metal mesh structure MM. If the touch electrode TE is, for example, a mutual capacitance type touch electrode, the touch electrode TE may be divided into a driving electrode Tx and a sensing electrode Rx. The driving electrode Tx has a plurality of channels, and each of the channels may be routed in the non-pixel area NA. The sensing electrode Rx has a plurality of channels, and each of the channels may be routed in the non-pixel area NA. A bridge BR may be formed at an overlapping location between the driving electrode Tx and the sensing electrode Rx.

A part of the touch electrode TE may overlap the camera see-through area HA. Since the sub-pixels SP are not disposed in the camera see-through area HA, the camera see-through area HA does not display an image. However, if the touch electrode TE is not disposed in the camera see-through area HA, there may be a problem in forming mutual capacitance. Therefore, the accuracy of touch recognition may be degraded. On the contrary, if the touch electrode TE is disposed in the camera see-through area HA, the quality of images taken by the camera module 1200 may be degraded due to the touch electrode TE having a metal mesh structure MM.

In the display device according to still another embodiment of the present disclosure, the touch electrode TE of the touch panel TP has a relatively lower pitch in the camera see-through area HA than in the pixel area AA. For example, a pitch of the touch electrode TE in the camera see-through area HA may be two times lower than a pitch of the touch electrode TE in the pixel area AA.

The touch panel TP may be formed on the encapsulation unit 140. A touch buffer layer 160 may be formed on the encapsulation unit 140. The touch buffer layer 160 may be formed of an inorganic insulating layer. The touch electrode TE may have a metal mesh structure MM and may be formed of a single layer or a multilayer using a metal having high corrosion resistance and acid resistance with high conductivity, such as Al, Ti, Cu and Mo. A touch passivation layer 170 may be disposed on the touch electrode TE. The touch passivation layer 170 may be formed of an organic insulating layer or an inorganic insulating layer.

According to the above-described configuration, it is possible to improve the transmittance of the camera see-through area HA by reducing the density of the touch electrode TE in a local area of the touch panel TP in need of an improvement in transmittance. Also, when the touch electrode TE is designed, there is no need to perform an additional process.

Display devices 500, 600 and 700 according to still other embodiments of the present disclosure will be described with reference to FIG. 8 through FIG. 10.

The display devices 500, 600 and 700 according to still other embodiments of the present disclosure are substantially the same as the display device 400 according to still another embodiment of the present disclosure except for a different line width or pitch of the touch panel TP in the vicinity of the camera see-through area HA. Therefore, hereinafter, a redundant description will be omitted for convenience of explanation.

Figure 8:
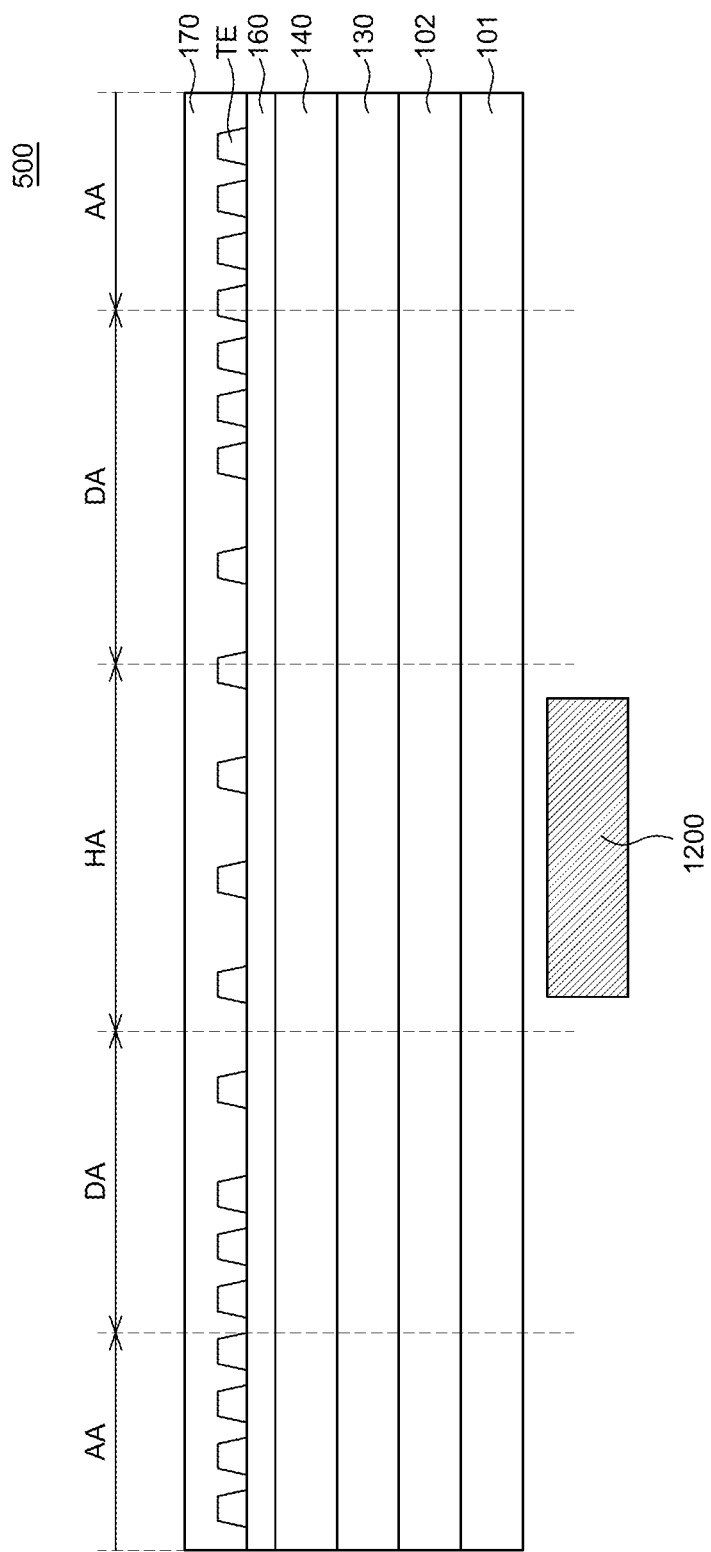
FIG. 8 is a cross-sectional view illustrating a touch device of a display device according to still another embodiment of the present disclosure.

Referring to FIG. 8, the touch electrode TE has a relatively lower pitch in the camera see-through area HA and at least part of the routing area DA adjacent to the camera see-through area HA than in the pixel area AA. According to the above-described configuration, it is possible to substantially improve a decrease in transmittance even when the camera module 1200 has a wide angle of view.

Figure 9:
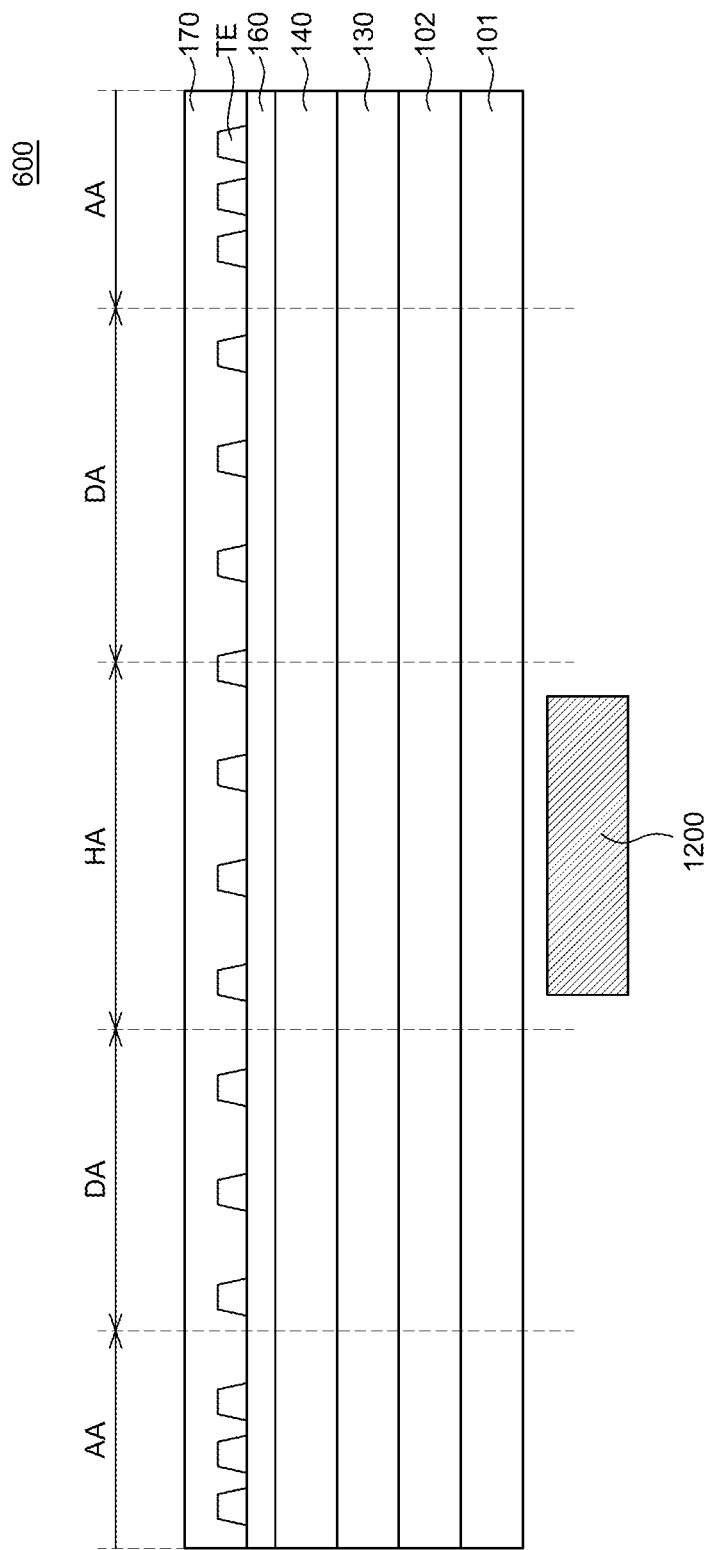
FIG. 9 is a cross-sectional view illustrating a touch device of a display device according to still another embodiment of the present disclosure.

Referring to FIG. 9, the touch electrode TE has a relatively lower pitch in the camera see-through area HA and the routing area DA adjacent to the camera see-through area HA than in the pixel area AA. According to the above-described configuration, it is possible to substantially improve a decrease in transmittance even when the camera module 1200 has a wide angle of view.

Figure 10:
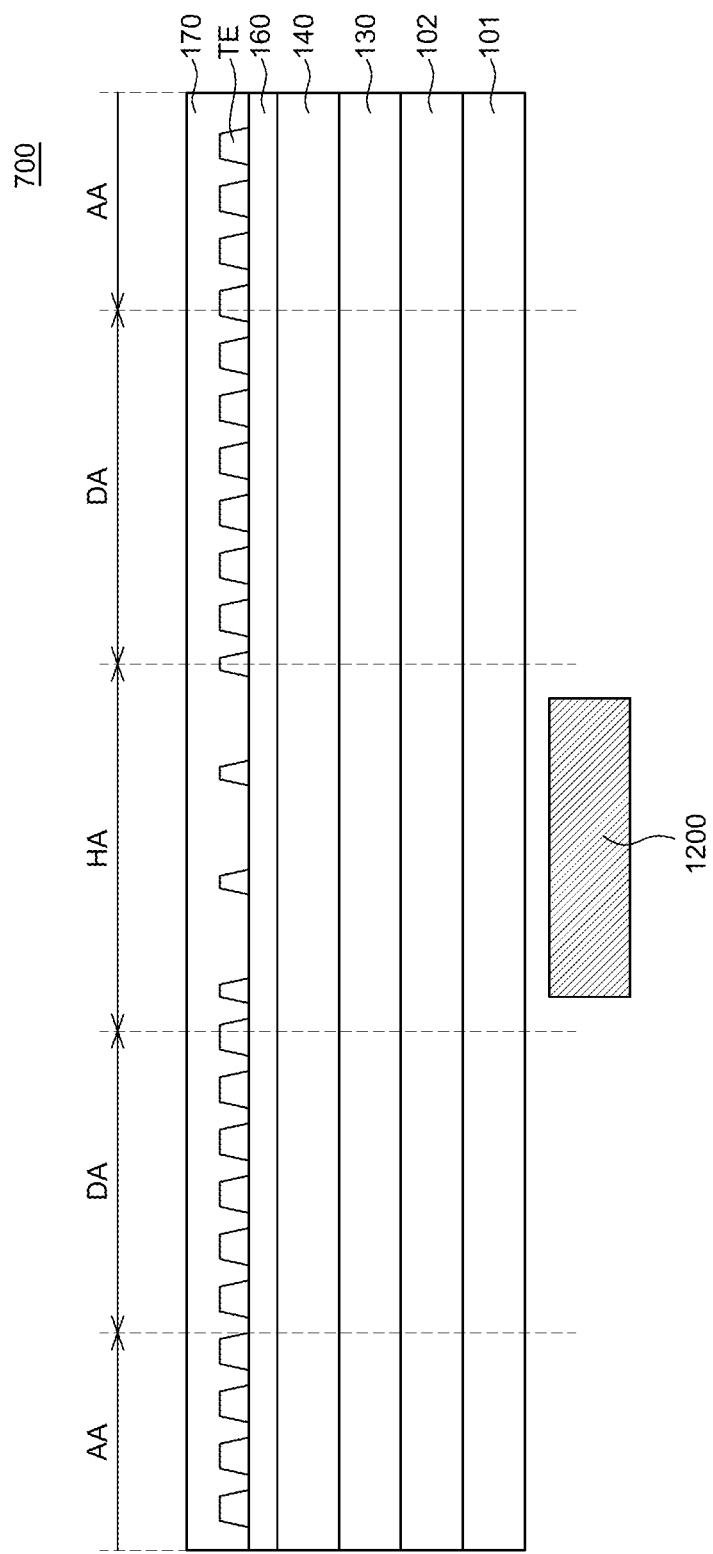
FIG. 10 is a cross-sectional view illustrating a touch device of a display device according to still another embodiment of the present disclosure.

Referring to FIG. 10, the touch electrode TE has a relatively lower pitch in at least the camera see-through area HA than in the pixel area AA and the touch electrode TE has a relatively smaller line width in at least the camera see-through area HA than in the pixel area AA. According to the above-described configuration, the transmittance of the camera see-through area HA may be further improved.

Some of the various embodiments described in the present disclosure may be combined selectively and implemented.

The embodiments of the present disclosure can also be described as follows:

According to an aspect of the present disclosure, there is provided a display device. The display device includes a see-through area for camera in which a camera module is disposed, a routing area disposed around the see-through area for camera and bypassed by at least one data line and scan line, a pixel area which includes the see-through area for camera and the routing area and includes a plurality of sub-pixels including an organic light emitting element and a cathode is disposed therein and a touch panel having a metal mesh structure on the pixel area, the see-through area for camera and the routing area, wherein a touch electrode of the touch panel may have a relatively lower pitch in the see-through area for camera than in the pixel area.

The plurality of sub-pixels may be not disposed in the see-through area for camera.

The plurality of sub-pixels may be not disposed in the routing area.

The display device may further include a first inorganic encapsulation layer covering the pixel area, a foreign material cover layer on the first inorganic encapsulation layer and a second inorganic encapsulation layer on the foreign material cover layer.

The second inorganic encapsulation layer may be flat or substantially flat in the see-through area for camera and the routing area.

The pixel area may include an overcoating layer and a bank-spacer layer, and the see-through area for camera may not include the overcoating layer and the bank-spacer layer.

The see-through area for camera may not include at least the organic light emitting element.

The see-through area for camera may not include at least the cathode.

The cathode may be a translucent electrode.

The pixel area may include an overcoating layer and a bank-spacer layer, and the overcoating layer and the bank-spacer layer may be extended to the see-through area for camera a second inorganic encapsulation layer on the foreign material cover layer.

The touch panel may be disposed on the second inorganic encapsulation layer.

The touch electrode may have a lower pitch in the see-through area for camera and the routing area adjacent to the see-through area for camera than in the pixel area.

The touch electrode may have a lower pitch in the see-through area for camera than in the pixel area, and the touch electrode may have a smaller line width in at least the see-through area for camera than in the pixel area.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
    a flexible substrate having a pixel area and a see-through area within the pixel area;
    a driving transistor, a switching transistor, and a data line disposed in the pixel area;
    a first electrode, a second electrode, and an emission layer between the first electrode and the second electrode;
    an encapsulation part over the substrate; and
    a touch panel over the encapsulation part, the touch panel including a plurality of touch electrodes,
    wherein a portion of at least one of the data line are curved in a routing area adjacent to the see-through area, and
    wherein at least one touch electrode of the plurality of touch electrodes overlaps with the see-through area from a plan view.

2. The display device according to claim 1, further comprising:
    a dam laterally surrounding a periphery of the pixel area,
    wherein at least one of the data line and the scan line overlaps the dam.

3. The display device according to claim 2, further comprising a pad disposed on opposite sides of the see-through area,
    wherein at least one of the data line and the scan line is electrically connected to the pad.

4. The display device according to claim 1, wherein the routing area is disposed between the pixel area and the see-through area.

5. The display device according to claim 4, wherein the routing area overlaps the curved portion of the data line or the scan line.

6. The display device according to claim 4, further comprising a bridge at least partially overlapping the routing area.

7. The display device according to claim 4, wherein the see-through area is an area where a camera module is disposed, and
    wherein the touch panel is disposed at the pixel area, the see-through area, and the routing area.

8. The display device according to claim 4,
    wherein the pixel area includes a plurality of sub-pixels including an organic light emitting element,
    wherein the pixel area includes an overcoating layer and at least one of a bank and a spacer or both, and
    wherein the see-through area does not include the overcoating layer, the bank, and the spacer.

9. The display device according to claim 4, wherein the pixel area includes an overcoating layer and at least one of a bank and a spacer or both, and
    wherein the overcoating layer and at least one of the bank and the spacer are extended to the see-through area.

10. The display device according to claim 8, wherein the see-through area does not include the organic light emitting element.

11. The display device according to claim 1, wherein the substrate is composed of a first polyimide substrate, a substrate insulating layer, and a second polyimide substrate.

12. The display device according to claim 1, wherein the touch panel further comprises:
    a buffer layer on the encapsulation part; and
    a passivation layer,
    wherein the at least one touch electrode is on the buffer layer, and
    wherein the passivation layer is over the at least one touch electrode.

13. The display device according to claim 12, wherein the see-through area is an area where a camera module is disposed, and
    wherein the touch electrode has a different pitch in the see-through area from the pixel area.

14. The display device according to claim 12, wherein the see-through area is an area where a camera module is disposed, and
    wherein the touch electrode has a different line width in at least the see-through area within the pixel area.

15. The display device according to claim 12, wherein the touch panel has the metal mesh structure in the pixel area, the see-through area, and the routing area.

16. The display device according to claim 12, wherein the touch electrode is composed of a multilayer structure of Ti, Al, or an alloy thereof.

17. The display device according to claim 1, further comprising:
    a high-potential voltage supply line at a non-pixel area of the substrate.

18. The display device according to claim 1, wherein the see-through area does not include the second electrode.

19. The display device according to claim 1, wherein one of the driving transistor and the switching transistor includes an active layer, and
    wherein the active layer of one of the driving transistor and the switching transistor includes at least one of an amorphous semiconductor material, a polycrystalline semiconductor material, and an oxide semiconductor material.

20. The display device of claim 1, wherein the see-through area includes the emission layer.

21. A display device, comprising:
    a flexible substrate having a pixel area and a see-through area in the pixel area;
    a routing area positioned between the pixel area and the see-through area;
    a driving transistor, a switching transistor, and a data line disposed in the pixel area;
    a first electrode, a second electrode, and an emission layer between the first electrode and the second electrode;
    an encapsulation part over the substrate; and
    a touch panel over the encapsulation part,
    wherein a portion of at least one of the data line have a corresponding shape as a contour of the see-through area,
    wherein the emission layer is disposed on the see-through area.

* * * * *